(12) United States Patent
Patel et al.

(10) Patent No.: US 11,810,832 B2
(45) Date of Patent: Nov. 7, 2023

(54) HEAT SINK CONFIGURATION FOR MULTI-CHIP MODULE

(71) Applicant: Marvell Asia Pte, Ltd., Singapore (SG)

(72) Inventors: Janak Patel, South Burlington, VT (US); Richard Graf, Gray, ME (US); Manish Nayini, Wappingers Falls, NY (US); Nazmul Habib, Colchester, VT (US)

(73) Assignee: Marvell Asia Pte Ltd, Singapore (SG)

( * ) Notice: Subject to any disclaimer, the term of this patent is extended or adjusted under 35 U.S.C. 154(b) by 7 days.

(21) Appl. No.: 17/360,571

(22) Filed: Jun. 28, 2021

(65) Prior Publication Data

US 2021/0407879 A1    Dec. 30, 2021

Related U.S. Application Data

(60) Provisional application No. 63/045,668, filed on Jun. 29, 2020.

(51) Int. Cl.
*H01L 23/367* (2006.01)
*H01L 21/48* (2006.01)
*H01L 23/498* (2006.01)
*H01L 25/065* (2023.01)

(52) U.S. Cl.
CPC ........ *H01L 23/367* (2013.01); *H01L 21/4882* (2013.01); *H01L 23/49816* (2013.01); *H01L 23/49833* (2013.01); *H01L 23/49838* (2013.01); *H01L 25/0655* (2013.01)

(58) Field of Classification Search
CPC ... H01L 21/4882; H01L 23/36; H01L 23/367; H01L 23/3672; H01L 23/427; H01L 23/49816; H01L 23/49833; H01L 23/49838; H01L 25/0655
See application file for complete search history.

(56) References Cited

U.S. PATENT DOCUMENTS

| | | | |
|---|---|---|---|
| 6,359,781 B1* | 3/2002 | Hoss | G06F 1/20 361/720 |
| 7,128,135 B2 | 10/2006 | Mok et al. | |
| 10,477,728 B2 | 11/2019 | Yatskov et al. | |
| 2004/0190248 A1 | 9/2004 | Patel et al. | |
| 2015/0162307 A1* | 6/2015 | Chen | H01L 23/367 438/107 |
| 2015/0214155 A1 | 7/2015 | Lamorey et al. | |
| 2015/0243609 A1* | 8/2015 | Lamorey | H01L 25/165 361/717 |
| 2015/0255441 A1 | 9/2015 | Lamorey et al. | |
| 2016/0118315 A1 | 4/2016 | Smith et al. | |
| 2016/0286638 A1* | 9/2016 | Mitsui | H01L 23/427 |

(Continued)

OTHER PUBLICATIONS

International Search Report and Written Opinion for PCT/US2021/039429, dated Oct. 20, 2021 (22 pages).

*Primary Examiner* — Hung K Vu

(57) ABSTRACT

A multi-chip integrated circuit (IC) apparatus includes a substrate, one or more first IC chips mounted on the substrate, and a second IC chip mounted on the substrate. One or more first heat sinks are respectively thermally coupled to the one or more first IC chips. A second heat sink is thermally coupled to the second IC chip. An under side of the second heat sink is located further from the substrate than each of respective one or more top sides of the one or more first heat sinks.

12 Claims, 9 Drawing Sheets

(56) References Cited

U.S. PATENT DOCUMENTS

| | | |
|---|---|---|
| 2018/0054915 A1 | 2/2018 | Achard et al. |
| 2018/0068957 A1 | 3/2018 | Lamorey et al. |
| 2019/0053401 A1 | 2/2019 | Chang et al. |
| 2019/0378829 A1 | 12/2019 | Patel et al. |

* cited by examiner

HEAT SINK CONFIGURATION FOR MULTI-CHIP MODULE

CROSS REFERENCES TO RELATED APPLICATIONS

This application claims the benefit of U.S. Provisional Patent App. No. 63/045,668, entitled "Stacked Heat Sink Solution for Lidless Multi-Chip Module," filed on Jun. 29, 2020, the disclosure of which is hereby expressly incorporated herein by reference in its entirety.

FIELD OF TECHNOLOGY

The present disclosure relates generally to cooling of semiconductor chips, and more particularly to heat sinks for multi-chip modules.

BACKGROUND

A heat sink is often used to dissipate heat generated by an integrated circuit (IC) device or chip to prevent the operating temperature of the IC chip rising to an extent that causes the IC chip to overheat, which may cause the IC chip to malfunction or fail. Typically, a heat sink comprises a thermally conductive material that transfers heat away from the IC chip to thereby cool the IC chip and/or prevent the IC chip from overheating.

A multi-chip module includes multiple IC chips, each dissipating a potentially different amount of heat and/or having a potentially different maximum operating temperature. Some traditional heat sink systems for multi-chip modules attempt to use a single heat sink that lowers the operating temperature of multiple IC chips to a lowest maximum operating temperature of all of the IC chips. However, a heat sink capable of cooling an IC to a temperature far below the maximum operating temperature of the IC may have a prohibitively large size and/or be expensive.

Another traditional heat dissipation solution for multi-chip modules is using individual heat sinks for individual IC chips. However, the area consumed by multiple heat sinks often limits the number of IC chips that can be included within a multi-chip module of a given size.

SUMMARY

In an embodiment, a multi-chip integrated circuit (IC) apparatus comprises: a substrate; one or more first IC chips mounted on the substrate; a second IC chip mounted on the substrate; one or more first heat sinks respectively thermally coupled to the one or more first IC chips, each first heat sink having i) a respective bottom side, and ii) a respective top side opposite the respective bottom side, the respective top side being located further from the substrate than the respective bottom side; and a second heat sink having i) an under side, and ii) a top side opposite the under side, wherein: the second heat sink is thermally coupled to the second IC chip, the top side of the second heat sink is located further from the substrate than the under side of the second heat sink, and the under side of the second heat sink is located further from the substrate than each of the respective one or more top sides of the one or more first heat sinks.

In another embodiment, a method for assembling an apparatus having a substrate and one or more first IC chips and a second IC chip mounted on the substrate, includes: respectively thermally coupling one or more first heat sinks to the one or more first IC chips, each first heat sink having i) a respective bottom side, and ii) a respective top side opposite the respective bottom side, wherein each first heat sink is positioned so that the respective top side is located further from the substrate than the respective bottom side; and after respectively thermally coupling the one or more first heat sinks to the one or more first IC chips, thermally coupling a second heat sink to the second IC chip, the second heat sink having i) an under side, and ii) a top side opposite the under side, wherein the second heat sink is positioned so that: the top side of the second heat sink is located further from the substrate than the under side of the second heat sink, and the under side of the second heat sink is located further from the substrate than each of the respective one or more top sides of the one or more first heat sinks.

DETAILED DESCRIPTION

In various embodiments described below, multiple heat sinks are positioned in different tiers of heights above a substrate of a multi-chip module and are used to dissipate heat from multiple integrated circuit (IC) chips on the multi-chip module. The different heat sinks are thermally coupled to different IC chips facilitating differentiated cooling of the multiple IC chips, which may dissipate potentially different amounts of heat and/or have different maximum operating temperatures, according to an embodiment. Additionally, because the heat sinks are in different tiers of heights from the substrate of the multi-chip module, an area occupied by the heat sinks is smaller as compared to a system in which all of the heat sinks were at about the same height (or substantially co-planar) from the substrate.

Figure 1:
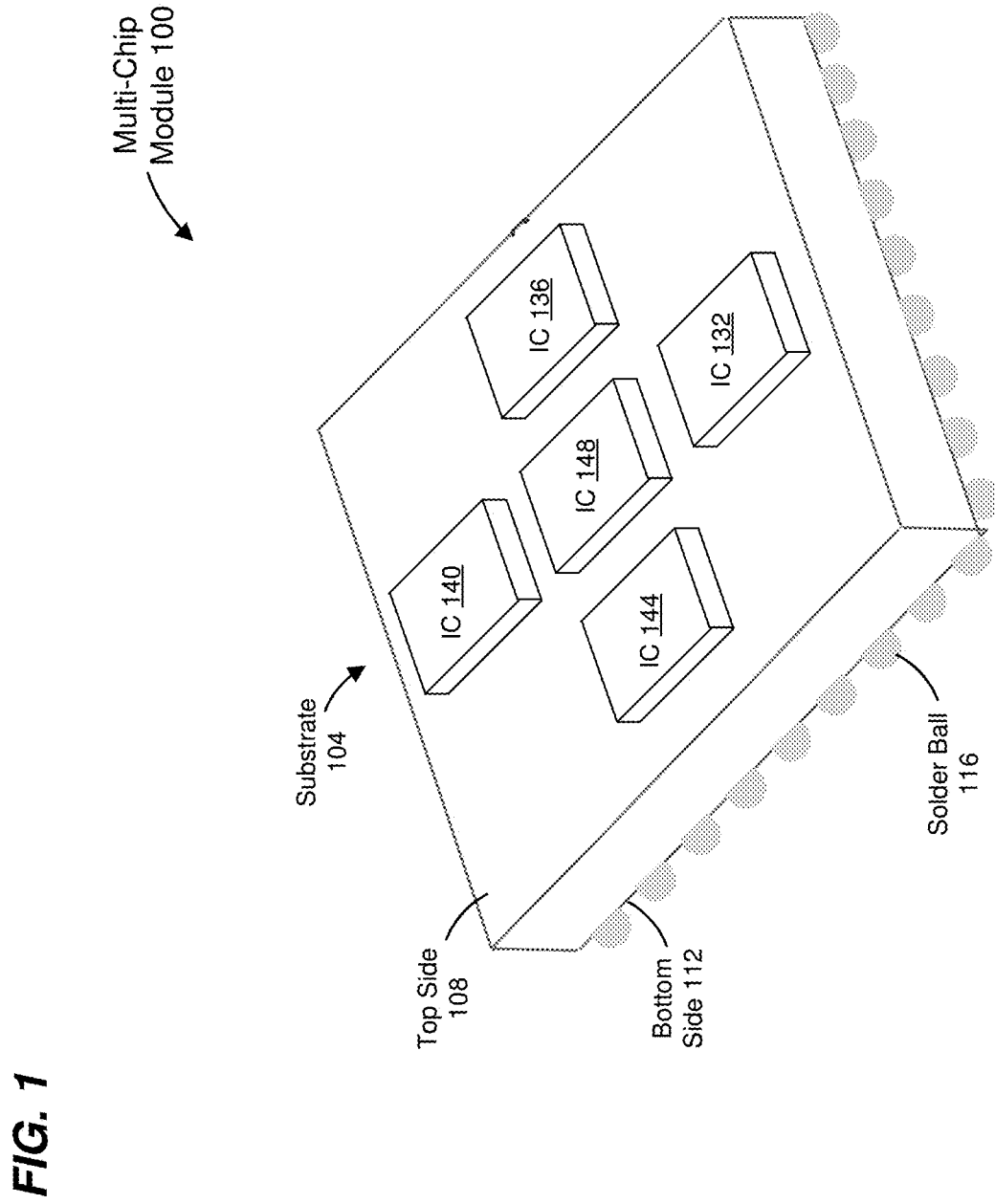
FIG. 1 is a diagram of an example multi-chip module with which embodiments of heat sink systems described herein are used, according to an embodiment.

FIG. 1 is a diagram of an example multi-chip module 100, according to an embodiment. As will be described below, the multi-chip module 100 is used with embodiments of heat sink systems in which multiple heat sinks are positioned in different tiers of heights from a substrate 104 of the multi-chip module 100.

The substrate comprises a suitable material such as a multi-layered laminated printed circuit board (PCB), a ceramic substrate, a silicon substrate, etc. The substrate 104 includes a top side 108 and a bottom side 112, which is opposite the top side 108. In an embodiment, the multi-chip module 100 is a ball grid array (BGA) and a plurality of solder balls 116 are mounted to the bottom side 112 in a grid. In other embodiments, the multi-chip module 100 uses a suitable packaging technology other than BGA, such as pin grid array (PGA), land grid array, etc. In such embodiments, the solder balls 116 are not mounted to the bottom side 112; rather other suitable electrical connection elements are mounted to the bottom side 112 (and/or other suitable locations on the substrate 104), such as pins, pads, etc.

A plurality of IC chips are mounted to the top side 108 of the substrate 104, including: a first IC chip 132, a second IC chip 136, a third IC chip 140, a fourth IC chip 144, and a fifth IC chip 148. Although the multi-chip module 100 is illustrated in FIG. 1 as having five IC chips, the multi-chip module 100 includes another suitable number of IC chips (e.g., 2, 3, 4, 6, 7, 8, etc.) in various other embodiments.

Figure 2:
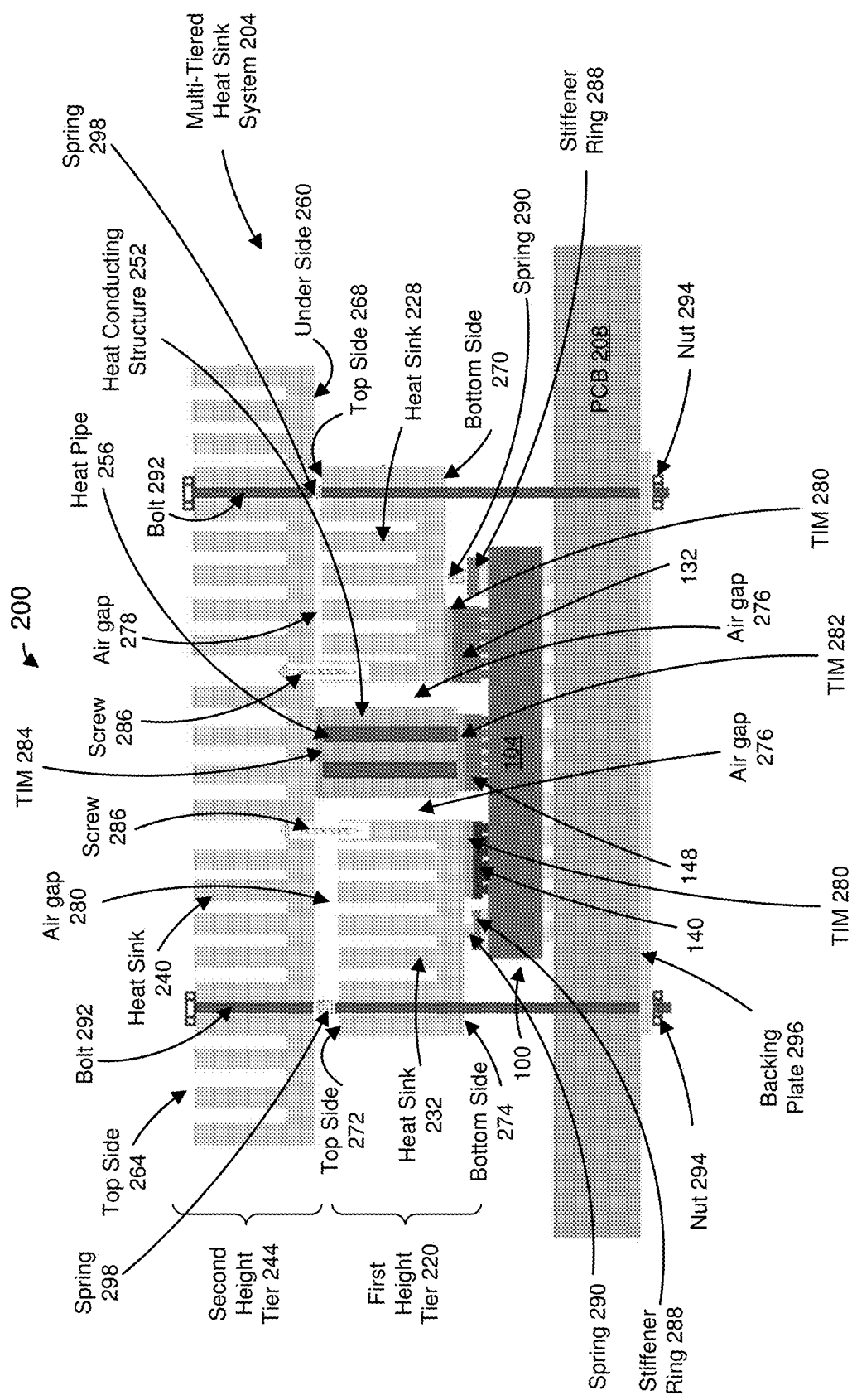
FIG. 2 is a diagram illustrating a cross section of an example system that uses a multi-tiered heat sink system in conjunction with the example multi-chip module of FIG. 1, according to an embodiment.

FIG. 2 is a diagram illustrating a cross section of an example system 200 that uses a multi-tiered heat sink system 204 with the example multi-chip module 100 of FIG. 1, according to an embodiment. In the system 200, the multi-chip module 100 is mounted to a PCB 208.

The multi-tiered heat sink system 204 comprises a plurality of first heat sinks in a first height tier 220 above the substrate 104. Heat sinks within a particular height tier can be considered to be substantially co-planar relative to one another. For example, the plurality of first heat sinks in the first height tier 220 comprises a heat sink 228 thermally coupled to the first IC chip 132, and a heat sink 232 thermally coupled to the third IC chip 140. The plurality of first heat sinks in the first height tier 220 comprises other heat sinks not shown in FIG. 2, including a heat sink thermally coupled to the second IC chip 136, and another heat sink thermally coupled to the fourth IC chip 144.

The multi-tiered heat sink system 204 also comprises a second heat sink 240 in a second height tier 244 above the substrate 104. In an embodiment, the second height tier 244 is above the first height tier 220 (i.e., a lowest portion of the second height tier 244 is further from the substrate 104 than a highest portion of the first height tier 220), and the second heat sink 240 is distanced further from the substrate 104 than the heat sinks in the first height tier 220. In such a case, any heat sink contained in the second height tier 244 would not be substantially co-planar with any heat sink contained in the first height tier 220.

The second heat sink 240 is thermally coupled to the fifth IC chip 148. In an embodiment, the second heat sink 240 is thermally coupled to the fifth IC chip 148 via a heat conducting structure 252. In an embodiment, the heat conducting structure 252 includes one or more heat pipes 256. Generally, heat conductivity is improved by increasing the number of heat pipes 256 within the heat conducting structure 252, but the number of heat pipes 256 that can be included is limited by a cross-sectional area of the heat conducting structure 252.

In an embodiment, the heat conducting structure 252 comprises copper or another material with suitable heat conducting properties. In various embodiments, each of the one or more heat pipes 256 comprises a sealed pipe or tube made of a suitable material such as copper, aluminum, etc. A suitable fluid is contained within the sealed pipe or tube, such as water, ammonia, etc., according to various embodiments. Generally, the material of the sealed pipe or tube is chosen to be compatible with the fluid contained within the sealed pipe or tube (e.g., copper tube used with water, aluminum tube used with ammonia, etc.). Generally, the fluid contained within the sealed pipe or tube is chosen so that the heat pipe 256 contains both vapor and liquid over an operating temperature range of the fifth IC chip 148, according to an embodiment.

In operation, at a first end of the heat pipe 256 proximate to the fifth IC chip 148, a liquid in contact with a surface of the pipe/tube turns into a vapor by absorbing heat from the surface. The vapor then travels along the heat pipe toward a second end of the heat pipe proximate to the heat sink 240 and condenses back into a liquid, releasing latent heat. The liquid then returns toward the first end of the heat pipe 256 through capillary action and/or gravity, and the cycle repeats.

In other embodiments, the heat conducting structure 252 is omitted, and the heat sink 240 comprises a column structure that protrudes through the first height tier 220 and that is thermally coupled to the fifth IC chip 148. In some such embodiments, the column structure is integral with the heat sink 240 and comprises the same material as the heat sink 240. In other such embodiments, the column structure is not integral with the heat sink 240 but is thermally coupled to the heat sink 240; and the column structure comprises the same material as the heat sink 240, or another suitable material with suitable heat conducting properties.

The heat sink 240 includes an under side 260 and a top side 264. The top side 264 is further from the substrate 104 than the under side 260. Each of the heat sinks in the first height tier 220 includes a respective top side and a respective bottom side, where the respective top side is further from the substrate 104 than the respective bottom side. For example, the heat sink 228 includes a top side 268 and a bottom side 270, and the heat sink 232 includes a top side 272 and a bottom side 274.

In the embodiment illustrated in FIG. 2, the under side 260 of the heat sink 240 is located at a height further from the substrate 104 as compared to i) a height of the top side 268 of the heat sink 228 and ii) a height of the top side 272 of the heat sink 232. In some embodiments, the under side 260 of the heat sink 240 is located at a height further from the substrate 104 as compared to respective heights of respective top sides of all of the first heat sinks in the first height tier 220. In other embodiments, the under side 260 of the heat sink 240 is located at a height further from the substrate 104 as compared to respective heights of one or more respective top sides of one or more first heat sinks in the first height tier 220, and closer to the substrate 104 as compared to respective heights of one or more respective top sides of one or more other first heat sinks in the first height tier 220.

In the embodiment illustrated in FIG. 2, the entire top side 268 of the heat sink 228 is located beneath the under side 260 of the heat sink 240, and the entire top side 272 of the heat sink 232 is located beneath the under side 260 of the heat sink 240; in other words, the heat sink 240 extends entirely over the heat sink 228 and extends entirely over the heat sink 232. In another embodiment, only a portion of the top side 268 of the heat sink 228 is located beneath the under side 260 of the heat sink 240, and/or only a portion of the top side 272 of the heat sink 232 is located beneath the under side 260 of the heat sink 240; in other words, the heat sink 240 extends over only a portion of the heat sink 228 and/or over only a portion of the heat sink 232. More generally, in some embodiments, at least respective portions of respective top sides (e.g., the entire top side or only a portion of the top side) of all of the first heat sinks in the first height tier 220 are located beneath the under side 260 of the heat sink 240; in other words, the heat sink 240 extends over at least a respective portion of the respective top side of each of the first heat sinks in the first height tier 220 (e.g., extends over the entire respective top side or only over a portion of the respective top side). In other embodiments, at least respective portions of respective top sides (e.g., the entire top side or only a portion of the top side) of one or more of the first heat sinks in the first height tier 220 are located beneath the under side 260 of the heat sink 240, and respective top sides of one or more other first heat sinks in the first height tier 220 are not located beneath any portion of the under side 260 of the heat sink 240; in other words, the heat sink 240 extends over at least a respective portion of the respective top side of each of one or more of the first heat sinks in the first height tier 220, but does not extend over any portion of the respective top side of each of one or more other first heat sinks in the first height tier 220.

The heat sink 240 is thermally insulated from all of, or at least some of, the first heat sinks in the first height tier 220, according to some embodiments. For example, the heat conducting structure 252 is positioned such that the heat conducting structure 252 is separated from adjacent first heat sinks in the first height tier 220 by an air gap 276, which provides thermal insulation between adjacent first heat sinks in the first height tier 220 and the heat conducting structure 252, according to an embodiment. Similarly, the heat sink 240 is positioned such that the underside 260 is separated from top sides of first heat sinks in the first height tier 220 by respective gaps, which provides thermal insulation between the first heat sinks in the first height tier 220 and the heat sink 240, according to an embodiment. For example, the underside 260 is separated from the top side 268 of the heat sink 228 by an air gap 278, and the underside 260 is separated from the top side 272 of the heat sink 232 by an air gap 278.

Figure 3A:
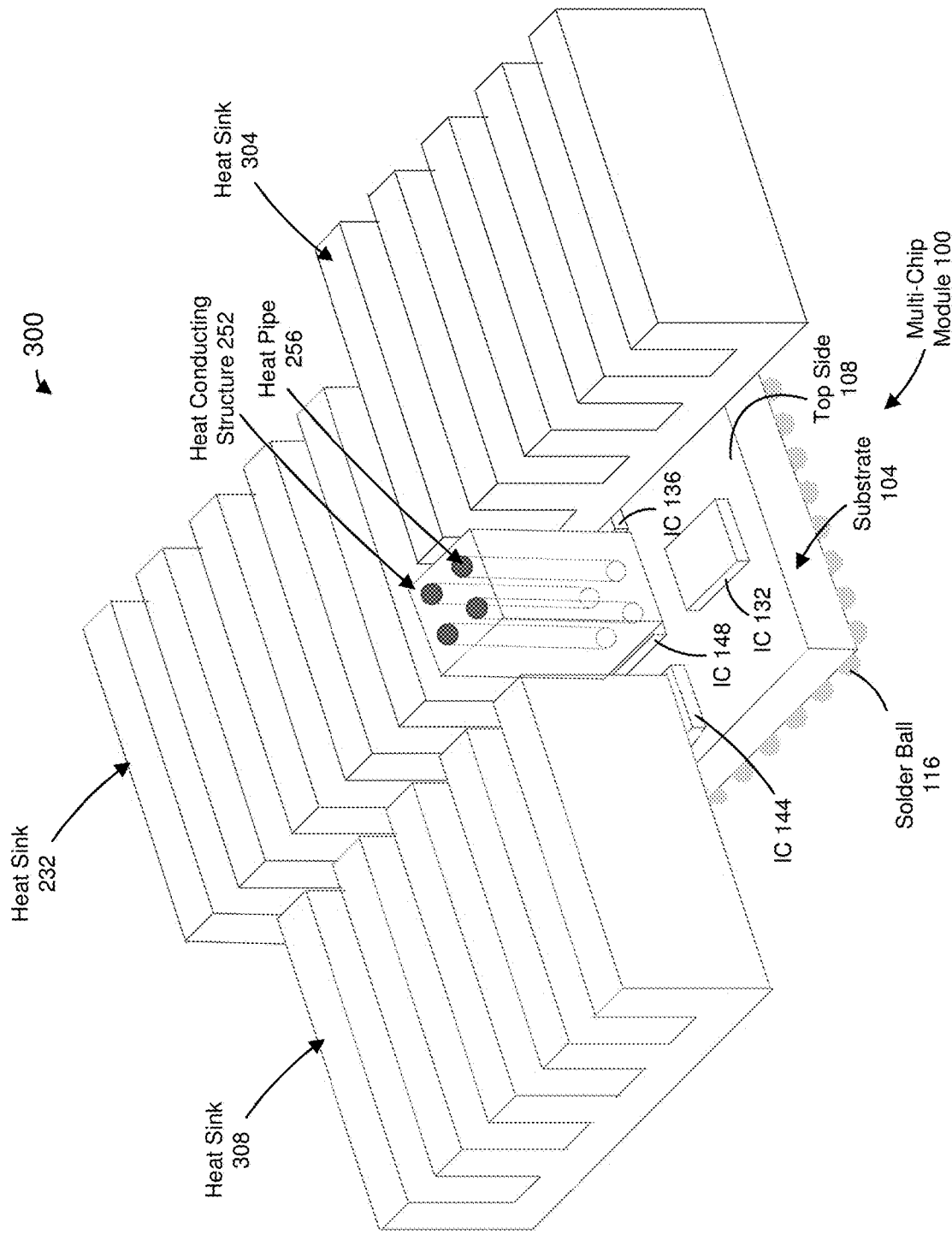
FIG. 3A is a simplified perspective view of a partially assembled system that includes the multi-chip module of FIG. 1 with heat sinks mounted to three integrated circuit (IC) chips on the multi-chip module, according to an embodiment.

FIG. 3A is a simplified perspective view of a partially assembled system 300 that includes the multi-chip module 100 of FIG. 1 with three of the first heat sinks in the first height tier 220 mounted to three of the IC chips on the multi-chip module 100, according to an embodiment. For example, the heat sink 232 is mounted to (and thermally coupled to) the third IC chip 140 (not shown in FIG. 3A), a heat sink 304 is mounted to (and thermally coupled to) the second IC chip 136, and a heat sink 308 is mounted to (and thermally coupled to) the fourth IC chip 144. The heat sink 232, the heat sink 304, and the heat sink 308 are depicted in FIG. 3A as being the same size and type merely for simplicity. In various embodiments, however, two or more of the heat sink 232, the heat sink 304, and the heat sink 308 may be the same size or different sizes, and may be of the same type or of different types of heat sinks.

Figure 3B:
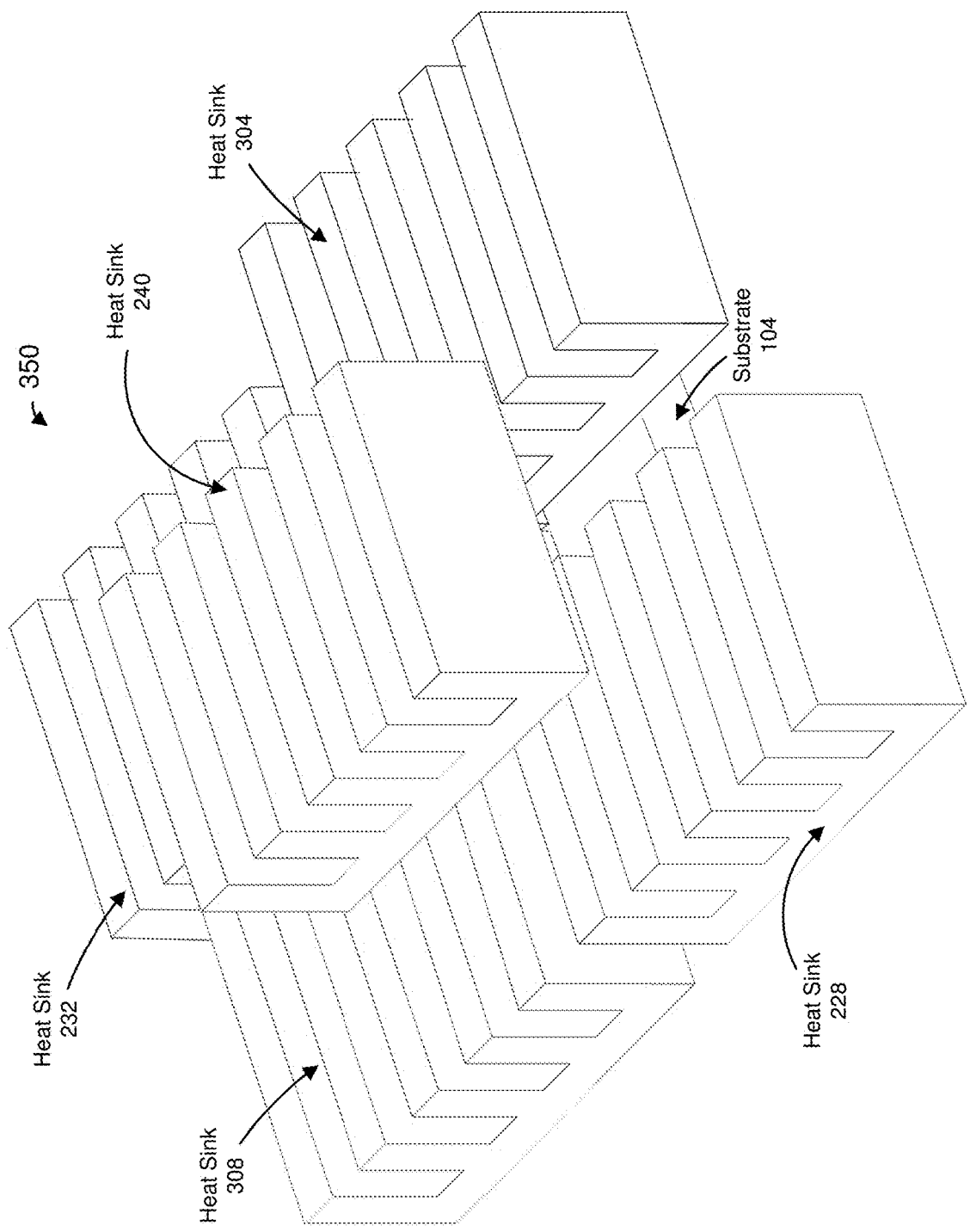
FIG. 3B is a simplified perspective view of a more fully assembled system that includes the multi-chip module of FIG. 1 with heat sinks of a multi-tiered heat sink system mounted to five IC chips on the multi-chip module, according to an embodiment.

FIG. 3B is a simplified perspective view of a more fully assembled system 350 that includes the multi-chip module 100 of FIG. 1 with all four of the first heat sinks in the first height tier 220 mounted to four of the IC chips on the multi-chip module 100, and the heat sink 240 mounted to the heat conducting structure 252 (not shown in FIG. 3B), according to an embodiment. For example, the heat sink 228 is mounted to (and thermally coupled to) the first IC chip 132 (not shown in FIG. 3B), the heat sink 304 is mounted to (and thermally coupled to) the second IC chip 136 (not shown in FIG. 3B), the heat sink 232 is mounted to (and thermally coupled to) the third IC chip 140 (not shown in FIG. 3B), the heat sink 308 is mounted to (and thermally coupled to) the fourth IC chip 144 (not shown in FIG. 3B), and the heat sink 240 mounted to the heat conducting structure 252 (not shown in FIG. 3B). The heat sinks are depicted in FIG. 3B as being the same size and type merely for simplicity. In various embodiments, however, two or more of the heat sinks may be the same size or different sizes, and may be of the same type or of different types of heat sinks. As merely one illustrative example, the heat sink 240 may be larger than the two or more first heat sinks in the first height tier 220 such that larger portions of the top sides of the two or more first heat sinks are underneath the under side of the heat sink 240, as discussed above and as illustrated in FIG. 2.

Referring again to FIG. 2, each of the first heat sinks in the first height tier 220 is thermally coupled to a respective IC chip with a thermal interface material (TIM) 280, according to an embodiment. In an embodiment, the TIM 280 is the same material for all of the IC chips. In other embodiments, different suitable TIMs are used for different IC chips. During manufacturing, the TIM 280 is first applied to the IC chip and the first heat sink is then pressed against the TIM 280, according to an embodiment. In another embodiment, during manufacturing, the TIM 280 is first applied to the first heat sink, and the portion of the first heat sink having the TIM 280 thereon is then pressed against the IC chip. In other embodiments, the first heat sinks in the first height tier 220 are thermally coupled to respective IC chips in another suitable manner.

The heat conducting structure 252 is thermally coupled to the fifth IC chip 148 with a TIM 282, according to an embodiment. In an embodiment, the TIM 282 is the same material as the TIM 280. In other embodiments, the TIM 282 is another suitable material different than the TIM 280. During manufacturing, the TIM 282 is first applied to the fifth IC chip 148 and the heat conducting structure 252 is then pressed against the TIM 282, according to an embodiment. In another embodiment, during manufacturing, the TIM 282 is first applied to the heat conducting structure 252, and the heat conducting structure 252 is then pressed against the fifth IC chip 148. In other embodiments, the heat conducting structure 252 is thermally coupled to the fifth IC chip 148 in another suitable manner. In an embodiment in which the heat conducting structure 252 is omitted and a heat conducting column is integral with the heat sink 240, the heat conducting column is thermally coupled to the fifth IC chip 148 using the TIM 282 in a similar manner.

The heat sink is thermally coupled to the heat conducting structure 252 with a TIM 284, according to an embodiment. In an embodiment, the TIM 284 is the same material as the TIM 282. In another embodiment, the TIM 284 a suitable material different than the TIM 282. During manufacturing, the TIM 284 is first applied to the heat conducting structure 252 and the heat sink 240 is then pressed against the heat conducting structure 252, according to an embodiment. In another embodiment, during manufacturing, the TIM 284 is first applied to the heat sink 240, and the portion of the heat sink 240 having the TIM 284 thereon is then pressed against the heat conducting structure 252. In other embodiments, the heat sink is thermally coupled to the heat conducting structure 252 in another suitable manner.

In an embodiment, the heat sink 240 is connected to one or more of the first heat sinks in the first height tier 220 using one or more screws 286 (or another suitable fastener device). The one or more screws 286 pass through one or more respective apertures in the heat sink 240 and are received in one or more respective threaded apertures in one or more respective first heat sinks.

In an embodiment, one or more respective springs (not shown in FIG. 2) are included in the air gap(s) between the under side 260 of the heat sink 240 and the top side(s) of the one or more first heat sinks, and the one or more screws 286 are inserted through the respective spring(s). When the screw(s) 286 are tightened during manufacture the spring(s) are compressed.

In various embodiments, the screws 286, springs (not shown), and/or spacers (not shown) are made of suitable material(s) (e.g., plastic or another suitable material) that reduced thermal coupling between the heat sink 240 and the one or more first heat sinks via the screws 286, springs (not shown), and/or spacers (not shown). In various embodiments, the screws 286, springs (not shown), and/or spacers (not shown) are coated in a suitable material(s) (e.g., plastic or another suitable material) that reduced thermal coupling between the heat sink 240 and the one or more first heat sinks via the screws 286, springs (not shown), and/or spacers (not shown).

In some embodiments, one or more respective spacers or springs are included in air gap(s) between respective bottom sides of the first heat sinks in the first height tier 220 and the top side 108 of the substrate 104 to provide stability. For example, respective stiffener rings 288 are mounted on the top side 108 of the substrate 104 in a suitable manner (e.g., using epoxy or another suitable fastening material), and respective springs 290 are inserted in the respective stiffener rings 288, according to an embodiment.

In an embodiment, the multi-tiered heat sink system 204 is attached to the PCB 208 via a plurality of bolts 292 and a plurality of nuts 294. The bolts 292 pass through respective apertures in the heat sink 240 and through respective apertures in the PCB 208. In an embodiment, a backing plate 296 is used between the PCB 208 and the nuts 294 to provide additional stability.

In some embodiments, one or more of the bolts 292 pass through respective apertures in one or more respective first heat sinks in the first height tier 220. In some such embodiments, spring(s) 298 are included in the air gaps between the under side 260 of the heat sink 240 and the top side(s) of the one or more first heat sinks, and the bolt(s) 292 are inserted through the respective spring(s). When the bolts 294 are tightened during manufacture the spring(s) 298 are compressed.

In some embodiments in which one or more of the bolts 292 pass through respective apertures in one or more respective first heat sinks in the first height tier 220, one or more respective spacers or springs (not shown in FIG. 2) are included in air gap(s) between respective bottom sides of the first heat sinks in the first height tier 220 and the PCB 208 to provide stability. When the bolts 294 are tightened during manufacture the spring(s) (if included) are compressed.

In various embodiments, the bolts 292, the springs 298, other springs (not shown), and/or spacers (not shown) are made of suitable material(s) (e.g., plastic or another suitable material) that reduced thermal coupling between the heat sink 240 and the one or more first heat sinks via the bolts 292, the springs 298, the other springs (not shown), and/or spacers (not shown). In various embodiments, the bolts 292, the springs 298, other springs (not shown), and/or spacers (not shown) are coated in a suitable material(s) (e.g., plastic or another suitable material) that reduced thermal coupling between the heat sink 240 and the one or more first heat sinks via the bolts 292, the springs 298, other springs (not shown), and/or spacers (not shown).

Although the example multi-tiered heat sink system 204 of FIG. 2 includes one heat sink for each IC chip on the multi-chip module 100, in other embodiments, one heat sink is provided for multiple IC chips and the multiple IC chips are thermally coupled to the one heat sink. As an illustrative example, one heat sink is provided for two or more of the IC chips 132, 136, 140, and 144, and the two or more of the IC chips are thermally coupled to the one heat sink. For instance, IC chips that dissipate similar amounts of heat and/or have similar maximum operating temperatures are coupled to one heat sink in the first height tier 220, in an embodiment. Thus, for example, multiple IC chips are thermally coupled to one heat sink in the first height tier 220 and/or multiple IC chips are thermally coupled to the heat sink 240 in the second height tier 244, in various embodiments. In some embodiments in which multiple IC chips are thermally coupled to the heat sink 240 in the second height tier 244, each IC chip is thermally coupled to the heat sink 240 via respective heat conducting structures (and/or heat conducting columns) similar to the heat conducting structure 252 (or heat conducting column) discussed above. In other embodiments in which multiple IC chips are thermally coupled to the heat sink 240 in the second height tier 244, the multiple IC chips are thermally coupled to the heat sink 240 via one heat conducting structure (or heat conducting column) similar to the heat conducting structure 252 (or heat conducting column) discussed above.

Although the example multi-tiered heat sink system 204 of FIG. 2 includes one heat sink 240 in the second height tier 244, in other embodiments, the second height tier 244 includes multiple heat sinks (e.g., substantially co-planar heat sinks) thermally coupled to multiple IC chips via respective heat conducting structures (and/or heat conducting columns) similar to the heat conducting structure 252 (or heat conducting column) discussed above.

In the example multi-tiered heat sink system 204 of FIG. 2, one heat sink 204 is positioned above multiple first heat sinks in the first height tier 220, at least according to some embodiments. In other embodiments, multiple heat sinks are positioned above one or more other heat sinks.

Figure 4:
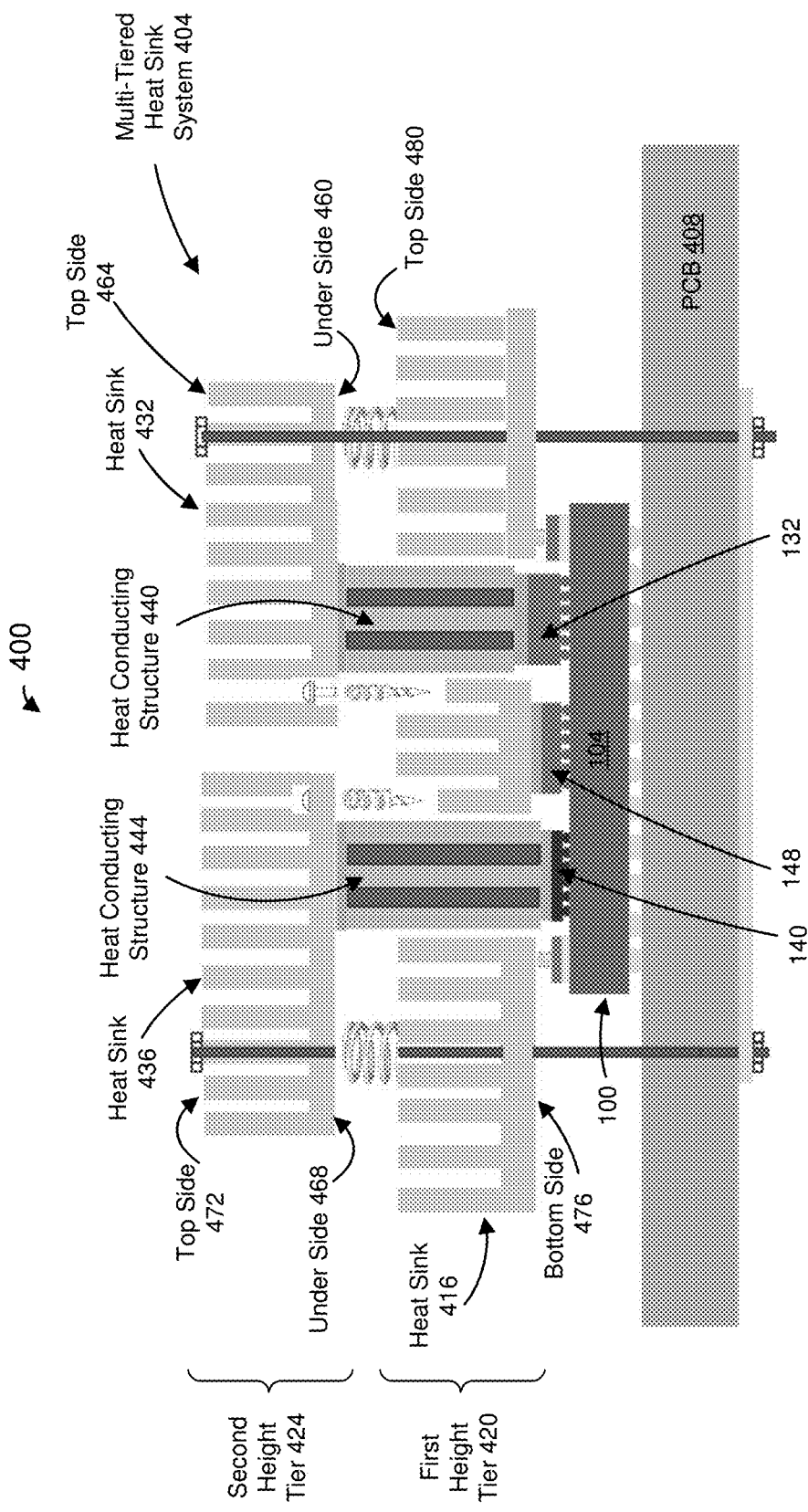
FIG. 4 is a diagram illustrating a cross section of another example system that uses a multi-tiered heat sink system in conjunction with the example multi-chip module of FIG. 1, according to an embodiment.

FIG. 4 is a diagram illustrating a cross section of another example system 400 that uses a multi-tiered heat sink system 404 with the example multi-chip module 100 of FIG. 1, according to an embodiment. In the system 400, the multi-chip module 400 is mounted to a PCB 408.

The multi-tiered heat sink system 404 comprises a first heat sink 416 in a first height tier 420 above the substrate 104. The first heat sink 416 is thermally coupled to the fifth IC chip 148 the same as or similar to the thermal coupling between the heat sink 228 and the IC chip 132 described with reference to FIG. 2, according to some embodiments.

The multi-tiered heat sink system 404 also comprises a plurality of second heat sinks in a second height tier 424 above the substrate 104. In an embodiment, the second height tier 424 is above the first height tier 420 (i.e., a lowest portion of the second height tier 424 is further from the substrate 104 than a highest portion of the first height tier 420), and the second heat sink 416 is distanced closer to the substrate 104 than the heat sinks in the second height tier 424.

For example, the plurality of second heat sinks in the second height tier 424 comprises a heat sink 432 thermally coupled to the first IC chip 132, and a heat sink 436 thermally coupled to the third IC chip 140. The plurality of second heat sinks in the second height tier 424 comprises other heat sinks not shown in FIG. 4, including a heat sink thermally coupled to the second IC chip 136, and another heat sink thermally coupled to the fourth IC chip 144, according to an embodiment.

In an embodiment, the heat sink 432 is thermally coupled to the first IC chip 132 via a heat conducting structure 440, and the heat sink 436 is thermally coupled to the third IC chip 140 via a heat conducting structure 444. In an embodiment, each of the heat conducting structure 440 and the heat conducting structure 444 has a same or similar structure as the heat conducting structure 252 as describe above with reference to FIG. 2. In some embodiments, the heat conducting structure 440 and the heat conducting structure 444 have a same structure (e.g., a same number of heat pipes, a same material, etc.), whereas in other embodiments the heat conducting structure 440 and the heat conducting structure 444 have different structures (e.g., different numbers of heat pipes, and/or different materials, etc.).

In an embodiment, the first heat sink 416 includes a plurality of apertures shaped to allow heat conducting structures to pass through to IC chips on the multi-chip module 100. For example, the first heat sink 416 includes a first aperture that allows the heat conducting structure 440 to pass through to the first IC chip 132 and a second aperture that allows the heat conducting structure 444 to pass through to the third IC chip 140, according to an embodiment.

In other embodiments, the heat conducting structure 440 is omitted, and the heat sink 432 includes a heat conducting column structure that is integral with the heat sink 432 and which thermally couples the heat sink 432 to the first IC chip 132; and/or the heat conducting structure 444 is omitted, and the heat sink 436 includes a heat conducting column structure that is integral with the heat sink 436 and which thermally couples the heat sink 432 to the third IC chip 140. In some such embodiments, the heat conducting column structure(s) of the heat sink 432 and/or the heat sink 436 pass through aperture(s) in the first heat sink 416 to thermally couple with IC chip(s) on the multi-chip module 100.

Each of the heat sinks in the second height tier 424 includes a respective top side and a respective under side, where the respective top side is further from the substrate 104 than the respective under side. For example, the heat sink 432 includes an under side 460 and a top side 464. The top side 464 is further from the substrate 104 than the under side 460. Also, the heat sink 436 includes an under side 468 and a top side 472. The top side 472 is further from the substrate 104 than the under side 468.

The heat sink 416 includes a bottom side 476 and a top side 480. The top side 480 is further from the substrate 104 than the bottom side 476.

In the embodiment illustrated in FIG. 4, the under side 460 of the heat sink 432 is located at a height further from the substrate 104 as compared to a height of the top side 480 of the heat sink 416. Additionally, the under side 468 of the heat sink 436 is located at a height further from the substrate 104 as compared to the height of the top side 480 of the heat sink 416.

In some embodiments, the height of the top side 480 of the heat sink 416 is below the respective height of the respective under side of each heat sink in the second height tier 424. In other embodiments, the height of the top side 480 of the heat sink 416 is above one or more respective heights of one or more respective under sides of one or more heat sinks in the second height tier 424. In such a case, any heat sink contained in the second height tier 424 would not be substantially co-planar with any heat sink contained in the first height tier 420.

In the embodiment illustrated in FIG. 4, a first portion of the top side 480 of the heat sink 416 is located below at least a portion of the under side 460 of the heat sink 432, and a second portion of the top side 480 of the heat sink 416 is located below at least a portion of the under side 468 of the heat sink 436; in other words, at least a portion of the heat sink 432 extends over the heat sink 416, and at least a portion of the heat sink 436 extends over the heat sink 416. In an embodiment, the first portion of the top side 480 of the heat sink 416 is located below the entire under side 460 of the heat sink 432, and/or the second portion of the top side 480 of the heat sink 416 is located below the entire under side 468 of the heat sink 436; in other words, the heat sink 432 extends over the heat sink 416, and the heat sink 436 extends over the heat sink 416.

The heat sink 416 is thermally insulated from all of, or at least some of, the heat sinks in the second height tier 424, according to some embodiments. For example, the heat conducting structure 440 is positioned such that the heat conducting structure 440 is separated from sides of the first aperture of the heat sink 416 by an air gap, which provides thermal insulation between the heat sink 416 and the heat conducting structure 440, according to an embodiment. Similarly, the heat conducting structure 444 is positioned such that the heat conducting structure 444 is separated from sides of the second aperture of the heat sink 416 by an air gap, which provides thermal insulation between the heat sink 416 and the heat conducting structure 444, according to an embodiment.

Also, the heat sink 432 is positioned such that the underside 460 is separated from the top side 480 of the heat sink 416, which provides thermal insulation between the heat sink 416 and the heat sink 432, according to an embodiment. Similarly, the heat sink 436 is positioned such that the underside 468 is separated from the top side 480 of the heat sink 416, which provides thermal insulation between the heat sink 416 and the heat sink 436, according to an embodiment.

The heat sink 416 is thermally coupled to the fifth IC chip 148 by a TIM in the same or similar manner as the heat sink 228 (FIG. 2) is thermally coupled to the first IC chip 132 as discussed above with reference to FIG. 2. The heat conducting structure 440 is thermally coupled to the first IC chip 132 by a TIM in the same or similar manner as the heat conducting structure 252 (FIG. 2) is thermally coupled to the fifth IC chip 148 as discussed above with reference to FIG. 2. The heat conducting structure 444 is thermally coupled to the third IC chip 140 by a TIM in the same or similar manner as the heat conducting structure 252 (FIG. 2) is thermally coupled to the fifth IC chip 148 as discussed above with reference to FIG. 2. The heat conducting structure 440 is thermally coupled to the heat sink 432 by a TIM in the same or similar manner as the heat conducting structure 252 (FIG. 2) is thermally coupled to the heat sink 240 as discussed above with reference to FIG. 2. The heat conducting structure 444 is thermally coupled to the heat sink 436 by a TIM in the same or similar manner as the heat conducting structure 252 (FIG. 2) is thermally coupled to the heat sink 240 as discussed above with reference to FIG. 2.

In some embodiments, the heat sink 432 is connected to the heat sink 416 using one or more screws (or another suitable fastener device) in the same or similar manner as the heat sink 240 (FIG. 2) is connected to one or more of the first heat sinks in the first height tier 220 (FIG. 2) using the one or more screws 286 (or another suitable fastener device), as discussed above with reference to FIG. 2. Similarly, in some embodiments, the heat sink 436 is connected to the heat sink 416 using one or more screws (or another suitable fastener device) in the same or similar manner as the heat sink 240 (FIG. 2) is connected to one or more of the first heat sinks in the first height tier 220 (FIG. 2) using the one or more screws 286 (or another suitable fastener device), as discussed above with reference to FIG. 2.

In some embodiments, the multi-tiered heat sink system 404 is attached to the PCB 408 via a plurality of bolts and a plurality of nuts in the same or similar manner as the multi-tiered heat sink system 204 (FIG. 2) is attached to the PCB 208 (FIG. 2) via the plurality of bolts 292 and the plurality of nuts 294, as discussed above with reference to FIG. 2.

Springs and/or spacers are used to increase stability in the same or similar manner as screws, springs, and/or spacers were used to increase stability in the system 200 (FIG. 2), as discussed above with reference to FIG. 2.

Although the example multi-tiered heat sink system 404 of FIG. 4 includes one heat sink for each IC chip on the multi-chip module 100, in other embodiments, one heat sink is provided for multiple IC chips and the multiple IC chips are thermally coupled to the one heat sink. As an illustrative example, one heat sink is provided for two or more of the IC chips 132, 136, 140, and 144, and the two or more of the IC chips are thermally coupled to the one heat sink. For instance, IC chips that dissipate similar amounts of heat and/or have similar maximum operating temperatures are coupled to one heat sink in the second height tier 424, in an embodiment. Thus, for example, multiple IC chips are thermally coupled to the heat sink 416 in the first height tier 420 and/or multiple IC chips are thermally coupled to one heat sink in the second height tier 424, in various embodiments.

In some embodiments in which multiple IC chips are thermally coupled to one heat sink in the second height tier 424, each IC chip is thermally coupled to the one heat sink via respective heat conducting structures (and/or heat conducting columns) similar to the heat conducting structures 432, 444 (or heat conducting column)s discussed above. In other embodiments in which multiple IC chips are thermally coupled to one heat sink in the second height tier 424, the multiple IC chips are thermally coupled to the one heat sink via one heat conducting structure (or heat conducting column) similar to the heat conducting structure 252 (or heat conducting column) discussed above.

Although the example multi-tiered heat sink system 404 of FIG. 4 includes one heat sink 416 in the first height tier 420, in other embodiments, the first height tier 420 includes multiple heat sinks (e.g., substantially co-planar heat sinks) thermally coupled to one IC chip (or multiple IC chips) using techniques such as discussed above.

In the example multi-tiered heat sink system 204 of FIG. 2 and the example multi-tiered heat sink system 404 of FIG. 4, heat sinks are arranged in two height tiers. In other embodiments, heat sinks are arranged in more than two height tiers.

Figure 5:
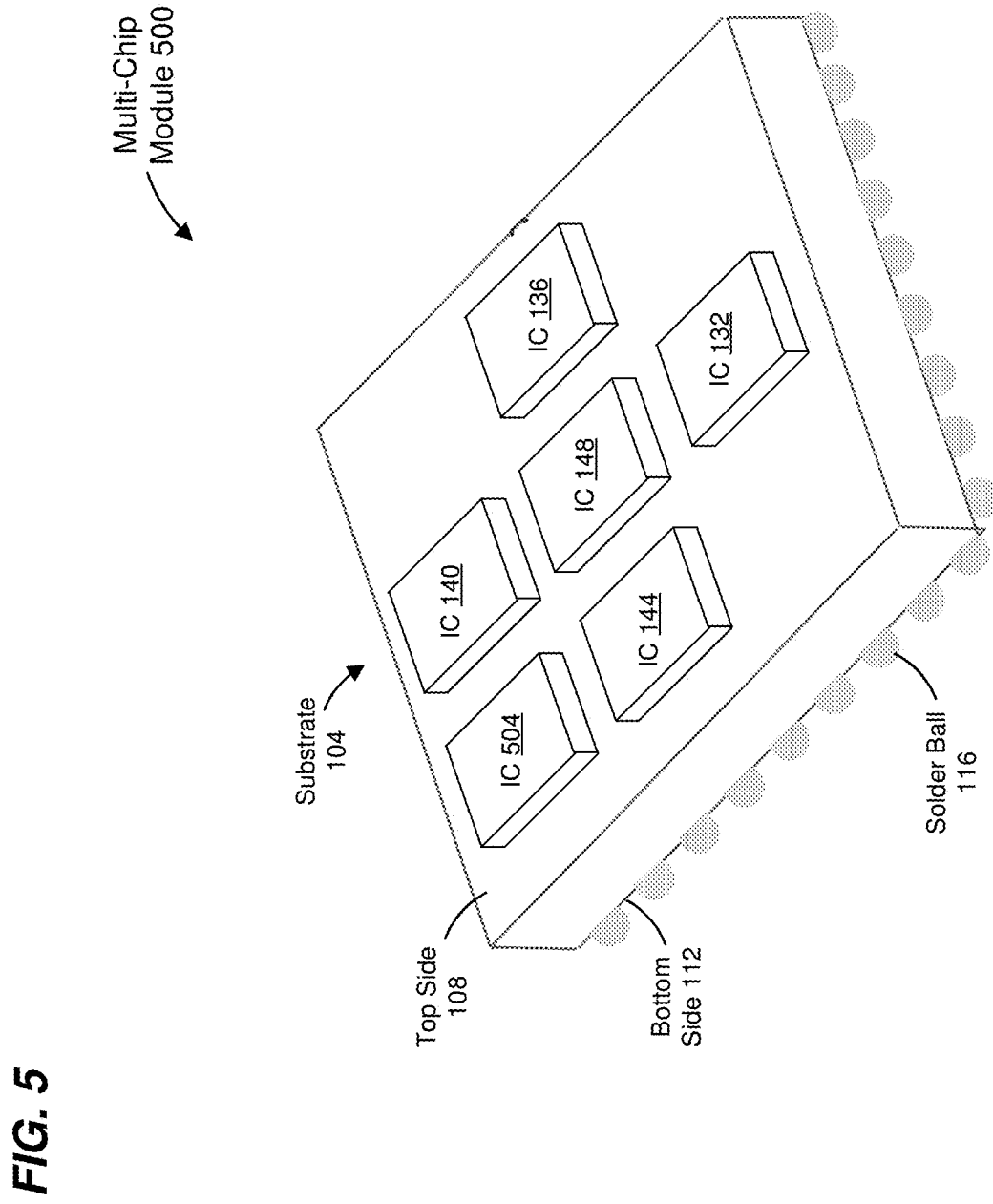
FIG. 5 is a diagram of another example multi-chip module with which embodiments of heat sink systems described herein are used, according to an embodiment.

FIG. 5 is a diagram of another example multi-chip module 500, according to an embodiment. The multi-chip module 500 is similar to the multi-chip module 100 of FIG. 1, and like-numbered elements are not described again in detail for purposes of brevity. As will be described below, the multi-chip module 500 is used with embodiments of heat sink systems in which multiple heat sinks are positioned in different tiers of heights from the substrate 104 of the multi-chip module 500.

A sixth IC chip 504 is also mounted to the substrate 104. Although the multi-chip module 500 is illustrated in FIG. 5 as having six IC chips, the multi-chip module 100 includes another suitable number of IC chips (e.g., 3, 4, 5, 7, 8, etc.) in various other embodiments.

Figure 6:
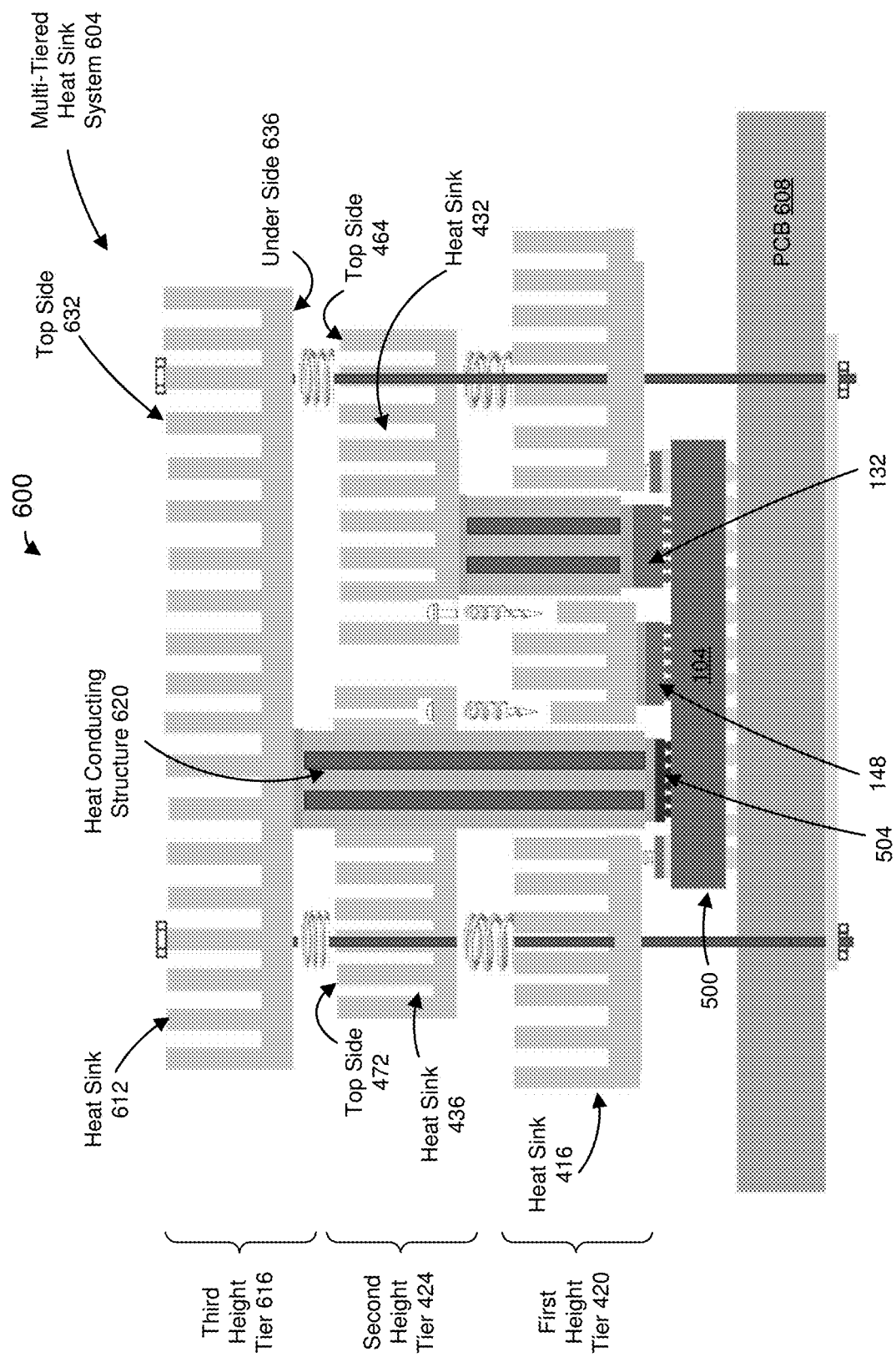
FIG. 6 is a diagram illustrating a cross section of an example system that uses a multi-tiered heat sink system in conjunction with the example multi-chip module of FIG. 5, according to an embodiment.

FIG. 6 is a diagram illustrating a cross section of another example system 600 that uses a multi-tiered heat sink system 604 with the example multi-chip module 500 of FIG. 5, according to an embodiment. The system 600 is similar to the system 400 of FIG. 4, and like-numbered elements are not described again in detail for purposes of brevity.

In the system 600, the multi-chip module 600 is mounted to a PCB 608.

The multi-tiered heat sink system 604 includes a third heat sink 612 in a third height tier 616 above the substrate 104. In an embodiment, the third height tier 616 is above the second height tier 424 (i.e., a lowest portion of the third height tier 616 is further from the substrate 104 than a highest portion of the second height tier 424), and the third heat sink 612 is distanced further from the substrate 104 than the heat sinks in the second height tier 424. In such a case, any heat sink contained in the third height tier 616 would not be substantially co-planar with any heat sink contained in the first height tier 420, and would not be substantially co-planar with any heat sink contained in the second height tier 424.

The third heat sink 612 is thermally coupled to the sixth IC chip 504 via a heat conducting structure 620, and the heat sink 436 is thermally coupled to the third IC chip 140 via the heat conducting structure 440. In an embodiment, the heat conducting structure 620 has a same or similar structure as the heat conducting structure 252 as describe above with reference to FIG. 2.

In other embodiments, the heat conducting structure 620 is omitted, and the heat sink 612 includes a heat conducting column structure that is integral with the heat sink 612 and which thermally couples the heat sink 612 to the sixth IC chip 504. In some such embodiments, the heat conducting column structure of the heat sink 612 passes through the aperture in the first heat sink 416 to thermally couple with the sixth IC chip on the multi-chip module 500.

In an embodiment, the first heat sink 416 includes an aperture shaped to allow the heat conducting structure 620 (or the heat conducting column structure integral with the heat sink 612) to pass through to the sixth IC chip 504. In an embodiment, the heat sink 436 also includes an aperture shaped to allow the heat conducting structure 620 (or the heat conducting column structure integral with the heat sink 612) to pass through to the sixth IC chip 504. In another embodiment, the heat conducting structure 620 (or the heat conducting column structure integral with the heat sink 612) is laterally spaced from a side of the heat sink 436 and does not pass through an aperture in the heat sink 436.

The heat sink 612 includes a top side 632 and an under side 636, where the top side 632 is further from the substrate 104 than the under side 636.

In the embodiment illustrated in FIG. 6, the under side 636 of the heat sink 612 is located at a height further from the substrate 104 as compared to i) the height of the top side 464 of the heat sink 432, and ii) the height of the top side 472 of the heat sink 436.

In some embodiments, the under side 636 of the heat sink 612 is located at a height further from the substrate 104 as compared to respective heights of respective top sides of all of the heat sinks in the second height tier 424. In other embodiments, the under side 636 of the heat sink 612 is located at a height further from the substrate 104 as compared to respective heights of one or more respective top sides of one or more heat sinks in the second height tier 424, and closer to the substrate 104 as compared to respective heights of one or more respective top sides of one or more other heat sinks in the second height tier 424.

In the embodiment illustrated in FIG. 6, the entire top side 464 of the heat sink 432 is located beneath the under side 636 of the heat sink 612, and the entire top side 472 of the heat sink 436 is located beneath the under side 636 of the heat sink 612; in other words, the heat sink 612 extends entirely over the heat sink 432 and extends entirely over the heat sink 436. In another embodiment, only a portion of the top side 464 of the heat sink 432 is located beneath the under side 636 of the heat sink 612, and/or only a portion of the top side 472 of the heat sink 436 is located beneath the under side 636 of the heat sink 612; in other words, the heat sink 612 extends over only a portion of the heat sink 432 and/or over only a portion of the heat sink 436.

The heat sink 612 is thermally insulated from the heat sink 416 in the first height tier 420, and from all of, or at least some of, the heat sinks in the second height tier 424, according to some embodiments. For example, the heat conducting structure 620 is positioned such that the heat conducting structure 620 is separated from sides of the aperture in the heat sink 416 by an air gap, which provides thermal insulation between the heat sink 416 and the heat conducting structure 620, according to an embodiment. Additionally, the heat conducting structure 620 is positioned such that the heat conducting structure 620 is separated from sides of the aperture in the heat sink 436 by an air gap, which provides thermal insulation between the heat sink 436 and the heat conducting structure 620, according to an embodiment.

Similarly, the heat sink 612 is positioned such that the underside 636 is separated from top sides of heat sinks in the second height tier 424 by respective gaps, which provides thermal insulation between the heat sinks in the second height tier 424 and the heat sink 612, according to an embodiment.

The heat conducting structure 620 is thermally coupled to the sixth IC chip 504 by a TIM in the same or similar manner as the heat conducting structure 252 (FIG. 2) is thermally coupled to the fifth IC chip 148 as discussed above with reference to FIG. 2. The heat conducting structure 620 is thermally coupled to the heat sink 612 by a TIM in the same or similar manner as the heat conducting structure 252 (FIG. 2) is thermally coupled to the heat sink 240 as discussed above with reference to FIG. 2.

In some embodiments, the heat sink 612 is connected to the heat sink 432 and/or the heat sink 436 using one or more screws (or another suitable fastener device, not shown) in the same or similar manner as the heat sink 240 (FIG. 2) is connected to one or more of the first heat sinks in the first height tier 220 (FIG. 2) using the one or more screws 286 (or another suitable fastener device), as discussed above with reference to FIG. 2.

In some embodiments, the multi-tiered heat sink system 604 is attached to the PCB 608 via a plurality of bolts and a plurality of nuts in the same or similar manner as the multi-tiered heat sink system 204 (FIG. 2) is attached to the PCB 208 (FIG. 2) via the plurality of bolts 292 and the plurality of nuts 294, as discussed above with reference to FIG. 2.

Springs and/or spacers are used to increase stability in the same or similar manner as screws, springs, and/or spacers were used to increase stability in the system 200 (FIG. 2), as discussed above with reference to FIG. 2.

In the example multi-tiered heat sink systems described above, heat conducting structures (e.g., the heat conducting structure 252 of FIG. 2, the heat conducting structures 440 and 444 of FIG. 4, and the heat conducting structure 620 of FIG. 6) are used to thermally couple IC chips with heat sinks located in higher height tiers of the multi-tiered heat sink systems. In other embodiments, similar heat conducting structures are used to fit more heat sinks within a single height tier.

Although the example multi-tiered heat sink system 604 of FIG. 6 includes one heat sink for each IC chip on the multi-chip module 500, in other embodiments, one heat sink is provided for multiple IC chips and the multiple IC chips are thermally coupled to the one heat sink. As an illustrative example, one heat sink is provided for two or more of the IC chips 132, 136, 140, and 144, and the two or more of the IC chips are thermally coupled to the one heat sink. For instance, IC chips that dissipate similar amounts of heat and/or have similar maximum operating temperatures are coupled to one heat sink in the second height tier 424, in an embodiment. Thus, for example, multiple IC chips are thermally coupled to the heat sink 416 in the first height tier 420, multiple IC chips are thermally coupled to one heat sink in the second height tier 424, and/or multiple IC chips are thermally coupled to the heat sink 612 in the third height tier 616, in various embodiments. In some embodiments in which multiple IC chips are thermally coupled to one heat sink in the second height tier 424, the multiple IC chips are thermally coupled to the one heat sink via one heat conducting structure (or heat conducting column) similar to the heat conducting structure 252 (or heat conducting column) discussed above. In other embodiments in which multiple IC chips are thermally coupled to one heat sink in the third height tier 616, the multiple IC chips are thermally coupled to the one heat sink via one heat conducting structure (or heat conducting column) similar to the heat conducting structure 252 (or heat conducting column) discussed above.

Although the example multi-tiered heat sink system 404 of FIG. 4 includes one heat sink 416 in the first height tier 420, in other embodiments, the first height tier 420 includes multiple heat sinks (e.g., substantially co-planar heat sinks) thermally coupled to one IC chip (or multiple IC chips) using techniques such as discussed above.

Although the example multi-tiered heat sink system 404 of FIG. 4 includes one heat sink 612 in the third height tier 616, in other embodiments, the third height tier 616 includes multiple heat sinks (e.g., substantially co-planar heat sinks) thermally coupled to one IC chip (or multiple IC chips) using one or more heat conducting structures (and/or one or more heat conducting columns) similar to the heat conducting structure 620 (or heat conducting column) discussed above.

Figure 7:
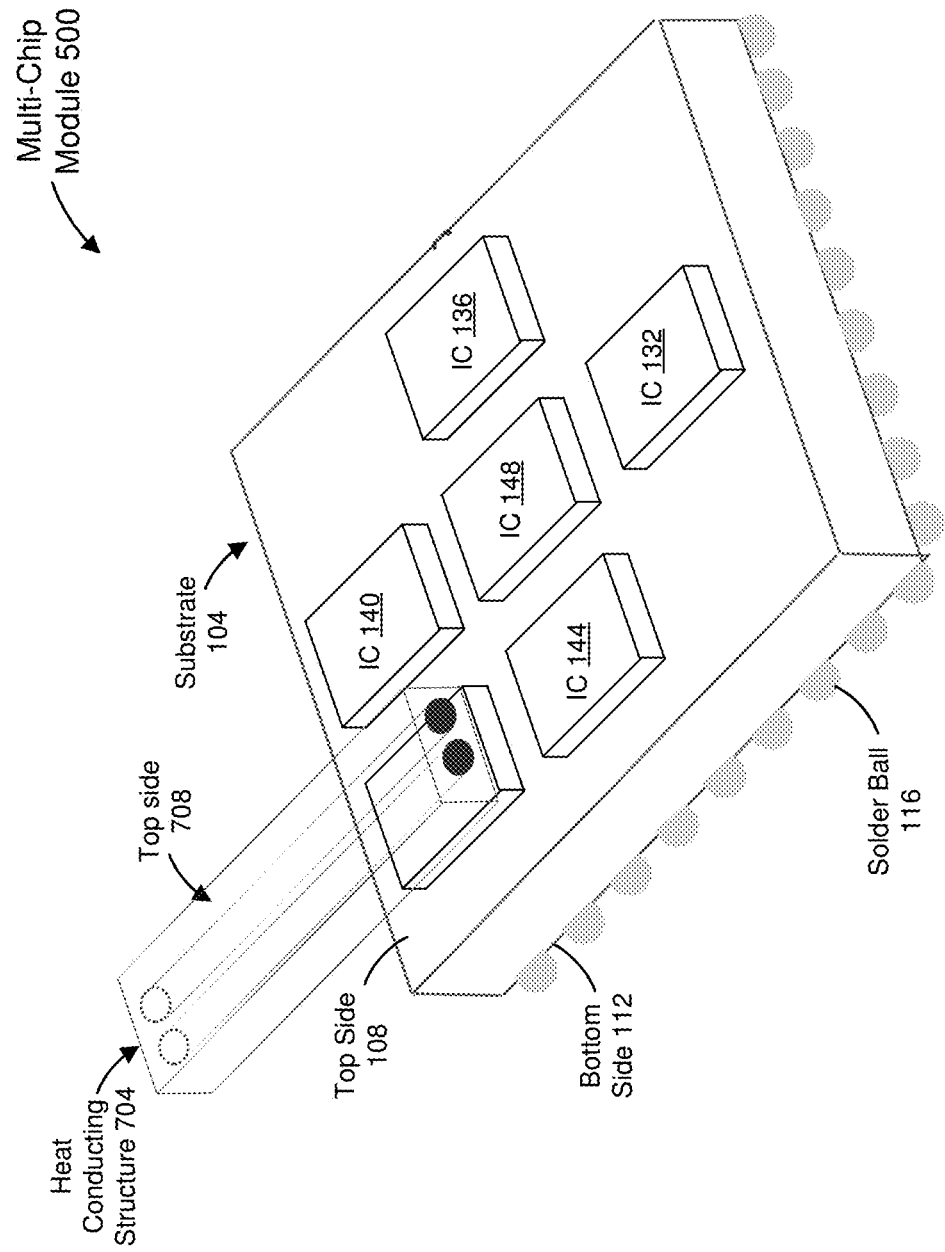
FIG. 7 is a diagram of the example multi-chip module of FIG. 5 with which a heat conducting structure is used to thermally couple a heat sink with an IC chip, according to an embodiment.

FIG. 7 is a diagram of the example multi-chip module 500 of FIG. 5 with which a heat conducting structure 704 is used to thermally couple a heat sink within a first height tier closest to the substrate 104, according to an embodiment. The heat conducting structure 704 is thermally coupled to the sixth IC chip 504, e.g., using a TIM or another suitable material.

In an embodiment, the heat conducting structure 704 has a same or similar structure as the heat conducting structure 252 as describe above with reference to FIG. 2. The heat conducting structure 704 includes a top side 708 to which a heat sink (not shown) can be thermally coupled, e.g., using a TIM or another suitable material. Use of the heat conducting structure 704 permits the heat sink to be spaced laterally away from the sixth IC chip 504, which may permit more heat sinks to be included in the first height tier closest to the substrate 104, according to an embodiment.

FIGS. 2, 3A, 3B, 4, and 6 depict extruded aluminum or copper heat sinks. In other embodiments, however, other suitable heat sinks are utilized, such as pin fin heat sinks, straight fin heat sinks, parallel stacked fins heat sinks, etc. In some embodiments, the same type of heat sink is used for all heat sinks in a multi-tiered heat sink system such as described above. In other embodiments, different types of heat sinks are used in a single multi-tiered heat sink system such as described above. In some embodiments, all heat sinks in one height tier are of the same first type, whereas one or more heat sinks in another height tier are of a different second type, in multi-tiered heat sink systems such as described above. In some embodiments, heat sinks in one height tier are of different types in multi-tiered heat sink systems such as described above. In some embodiments, a single heat sink comprises multiple materials in multi-tiered heat sink systems such as described above. As an illustrative example, a heat sink with fins comprises an aluminum base and copper fins, or vice versa.

Figure 8:
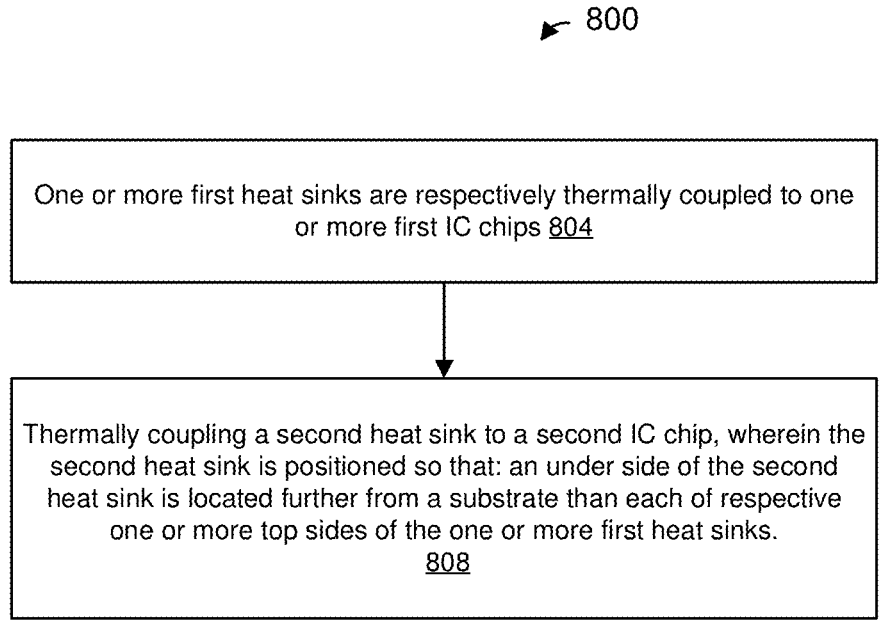
FIG. 8 is a flow diagram of an example method for assembling an apparatus that includes i) a substrate, ii) a plurality of IC chips mounted on the substrate, and iii) a plurality of heat sinks, according to an embodiment.

FIG. 8 is a flow diagram of an example method 800 for assembling an apparatus that includes i) a substrate, ii) one or more first IC chips and a second IC chip mounted on the substrate, and iii) a plurality of heat sinks, according to an embodiment. The method 800 is used in conjunction with a multi-chip module such as the multi-chip module 100 of FIG. 1, the multi-chip module 500 of FIG. 5, or another suitable multi-chip module. The method 800 is also used in conjunction with a multi-tiered heat sink system such as the multi-tiered heat sink system 204 of FIG. 2, the multi-tiered heat sink system 404 of FIG. 4, the multi-tiered heat sink system 604 of FIG. 6, or another suitable multi-tiered heat sink system.

At block 804, respectively thermally coupling one or more first heat sinks to the one or more first IC chips, each first heat sink having i) a respective bottom side, and ii) a respective top side opposite the respective bottom side, wherein each first heat sink is positioned so that the respective top side is located further from the substrate than the respective bottom side;

At block 808, thermally coupling a second heat sink to the second IC chip, the second heat sink having i) an under side, and ii) a top side opposite the under side, wherein the second heat sink is positioned so that: the top side of the second heat sink is located further from the substrate than the under side of the second heat sink, and the under side of the second heat sink is located further from the substrate than each of the respective one or more top sides of the one or more first heat sinks. In an embodiment, block 808 is performed after block 804 is performed.

In an embodiment, thermally coupling the second heat sink to the second IC chip at block 808 comprises thermally coupling the second heat sink to the second IC chip via a heat conducting structure. In an embodiment, a particular first heat sink includes an aperture; and the heat conducting structure is positioned to pass through the aperture.

In another embodiment, the second heat sink includes a heat conducting column structure that is integral with the second heat sink; and thermally coupling the second heat sink to the second IC chip comprises thermally coupling the heat conducting column structure to the second IC chip. In an embodiment, a particular first heat sink includes an aperture; and the heat conducting column structure is positioned to pass through the aperture.

In an embodiment, the method 800 further comprises attaching the second heat sink to the one or more first heat sinks.

In another embodiment, the method 800 further comprises mounting the substrate to a PCB; and compressing the one or more first heat sinks and the second heat sink toward the PCB.

In another embodiment, a third IC chip is mounted on the substrate; and the method 800 further comprises: after thermally coupling the second heat sink to the second IC chip, thermally coupling a third heat sink to the third IC chip, the third heat sink having i) an under side, and ii) a top side opposite the under side, wherein the third heat sink is positioned so that: the top side of the third heat sink is located further from the substrate than the under side of the third heat sink, and the under side of the third heat sink is located further from the substrate than the top side of the second heat sink.

In another embodiment, thermally coupling the third heat sink to the third IC chip comprises thermally coupling the third heat sink to the third IC chip via a heat conducting structure.

Embodiment 1: A multi-chip integrated circuit (IC) apparatus, comprising: a substrate; one or more first IC chips mounted on the substrate; a second IC chip mounted on the substrate; one or more first heat sinks respectively thermally coupled to the one or more first IC chips, each first heat sink having i) a respective bottom side, and ii) a respective top side opposite the respective bottom side, the respective top side being located further from the substrate than the respective bottom side; and a second heat sink having i) an under side, and ii) a top side opposite the under side, wherein: the second heat sink is thermally coupled to the second IC chip, the top side of the second heat sink is located further from the substrate than the under side of the second heat sink, and the under side of the second heat sink is located further from the substrate than each of the respective one or more top sides of the one or more first heat sinks.

Embodiment 2: The multi-chip IC apparatus of embodiment 1, wherein the second heat sink is thermally insulated from each of the one or more first heat sinks by one or more respective air gaps.

Embodiment 3: The multi-chip IC apparatus of either of embodiments 1 and 2, further comprising: a heat conducting structure thermally coupled to the second IC chip and thermally coupled to the second heat sink.

Embodiment 4: The multi-chip IC apparatus of embodiment 3, wherein the heat conducting structure comprises a plurality of heat pipes.

Embodiment 5: The multi-chip IC apparatus of either of embodiments 3 and 4, wherein: a particular first heat sink includes an aperture; and the heat conducting structure passes through the aperture.

Embodiment 6: The multi-chip IC apparatus of one of embodiments 3 and 4, wherein: the one or more first heat sinks include multiple first heat sinks; and the heat conducting structure is laterally spaced from the multiple first heat sinks.

Embodiment 7: The multi-chip IC apparatus of either of embodiments 1 and 2, wherein: the second heat sink includes a heat conducting column structure that is integral with the second heat sink; and the heat conducting column structure is thermally coupled to the second IC chip.

Embodiment 8: The multi-chip IC apparatus of any of embodiments 1-7, further comprising: a third IC chip mounted on the substrate; and a third heat sink having i) an under side, and ii) a top side opposite the under side, wherein: the third heat sink is thermally coupled to the third IC chip, the top side of the third heat sink is located further from the substrate than the under side of the third heat sink, and the under side of the third heat sink is located further from the substrate than the top side of the second heat sink.

Embodiment 9: The multi-chip IC apparatus of embodiment 8, further comprising: a heat conducting structure thermally coupled to the third IC chip and thermally coupled to the third heat sink.

Embodiment 10: The multi-chip IC apparatus of embodiment 9, wherein: the second heat sink includes an aperture; and the heat conducting structure passes through the aperture.

Embodiment 11: The multi-chip IC apparatus of embodiment 10, wherein: the aperture is a first aperture; a particular first heat sink includes a second aperture; and the heat conducting structure passes through the second aperture.

Embodiment 12: A method for assembling an apparatus that includes a substrate, and one or more first integrated circuit (IC) chips and a second IC chip mounted on the substrate, the method comprising: respectively thermally coupling one or more first heat sinks to the one or more first IC chips, each first heat sink having i) a respective bottom side, and ii) a respective top side opposite the respective bottom side, wherein each first heat sink is positioned so that the respective top side is located further from the substrate than the respective bottom side; and after respectively thermally coupling the one or more first heat sinks to the one or more first IC chips, thermally coupling a second heat sink to the second IC chip, the second heat sink having i) an under side, and ii) a top side opposite the under side, wherein the second heat sink is positioned so that: the top side of the second heat sink is located further from the substrate than the under side of the second heat sink, and the under side of the second heat sink is located further from the substrate than each of the respective one or more top sides of the one or more first heat sinks.

Embodiment 13: The method of embodiment 12, wherein thermally coupling the second heat sink to the second IC chip comprises thermally coupling the second heat sink to the second IC chip via a heat conducting structure.

Embodiment 14: The method of embodiment 13, wherein: a particular first heat sink includes an aperture; and the heat conducting structure is positioned to pass through the aperture.

Embodiment 15: The method of embodiment 12, wherein: the second heat sink includes a heat conducting column structure that is integral with the second heat sink; and thermally coupling the second heat sink to the second IC chip comprises thermally coupling the heat conducting column structure to the second IC chip.

Embodiment 16: The method of embodiment 15, wherein: a particular first heat sink includes an aperture; and the heat conducting column structure is positioned to pass through the aperture.

Embodiment 17: The method of any of embodiments 12-16, further comprising: attaching the second heat sink to the one or more first heat sinks.

Embodiment 18: The method of any of embodiments 12-17, further comprising: mounting the substrate to a printed circuit board (PCB); and compressing the one or more first heat sinks and the second heat sink toward the PCB.

Embodiment 19: The method of any of embodiments 12-18, wherein: a third IC chip is mounted on the substrate; and the method further comprises: after thermally coupling the second heat sink to the second IC chip, thermally coupling a third heat sink to the third IC chip, the third heat sink having i) an under side, and ii) a top side opposite the under side, wherein the third heat sink is positioned so that: the top side of the third heat sink is located further from the substrate than the under side of the third heat sink, and the under side of the third heat sink is located further from the substrate than the top side of the second heat sink.

Embodiment 20: The method of embodiment 19, wherein thermally coupling the third heat sink to the third IC chip comprises thermally coupling the third heat sink to the third IC chip via a heat conducting structure.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A multi-chip integrated circuit (IC) apparatus, comprising:
   a substrate;
   one or more first IC chips mounted on the substrate;
   a second IC chip mounted on the substrate;
   one or more first heat sinks respectively thermally coupled to the one or more first IC chips, each first heat sink having i) a respective bottom side, and ii) a respective top side opposite the respective bottom side, the respective top side being located further from the substrate in a first direction than the respective bottom side, a particular first heat sink among the one or more first heat sinks including an aperture;
   a second heat sink having i) an under side, and ii) a top side opposite the under side, wherein:
      the top side of the second heat sink is located further from the substrate in the first direction than the under side of the second heat sink, and
      the under side of the second heat sink is located further from the substrate in the first direction than each of the respective one or more top sides of the one or more first heat sinks; and
   a heat conducting structure, distinct from the second heat sink, that extends from the second IC chip in the first direction and through the aperture of the particular first heat sink to the under side of the second heat sink to thermally couple the second heat sink to the second IC chip, the heat conducting structure thermally coupled to the second IC chip and thermally coupled to the second heat sink.

2. The multi-chip IC apparatus of claim 1, wherein the second heat sink is thermally insulated from each of the one or more first heat sinks by one or more respective air gaps.

3. The multi-chip IC apparatus of claim 1, wherein the heat conducting structure comprises a plurality of heat pipes.

4. The multi-chip IC apparatus of claim 1, further comprising:
   a third IC chip mounted on the substrate; and
   a third heat sink having i) an under side, and ii) a top side opposite the under side, wherein:
      the third heat sink is thermally coupled to the third IC chip, the top side of the third heat sink is located further from the substrate in the first direction than the under side of the third heat sink, and the under side of the third heat sink is located further from the substrate in the first direction than the top side of the second heat sink.

5. The multi-chip IC apparatus of claim 4, wherein:

the heat conducting structure is a first heat conducting structure; and the multi-chip IC apparatus further comprises a second heat conducting structure thermally coupled to the third IC chip and thermally coupled to the third heat sink.

6. The multi-chip IC apparatus of claim 5, wherein:

the aperture is a first aperture;

the second heat sink includes a second aperture; and the second heat conducting structure passes through the second aperture.

7. The multi-chip IC apparatus of claim 6, wherein:

the particular first heat sink includes a third aperture; and the second heat conducting structure passes through the third aperture.

8. A method for assembling an apparatus that includes a substrate, and one or more first integrated circuit (IC) chips and a second IC chip mounted on the substrate, the method comprising:

respectively thermally coupling one or more first heat sinks to the one or more first IC chips, each first heat sink having i) a respective bottom side, and ii) a respective top side opposite the respective bottom side, wherein each first heat sink is positioned so that the respective top side is located further from the substrate in a first direction than the respective bottom side, a particular first heat sink among the one or more first heat sinks including an aperture; and after respectively thermally coupling the one or more first heat sinks to the one or more first IC chips, thermally coupling a second heat sink to the second IC chip via a heat conducting structure that is distinct from the second heat sink, the second heat sink having i) an under side, and ii) a top side opposite the under side, and the heat conducting structure extending in the first direction and through the aperture of the particular first heat sink from the second IC chip to the under side of the second heat sink wherein the second heat sink is positioned so that:

the top side of the second heat sink is located further from the substrate in the first direction than the under side of the second heat sink, and the under side of the second heat sink is located further from the substrate in the first direction than each of the respective one or more top sides of the one or more first heat sinks.

9. The method of claim 8, further comprising:

attaching the second heat sink to the one or more first heat sinks.

10. The method of claim 8, further comprising:

mounting the substrate to a printed circuit board (PCB); and compressing the one or more first heat sinks and the second heat sink toward the PCB.

11. The method of claim 8, wherein:

a third IC chip is mounted on the substrate; and the method further comprises:

after thermally coupling the second heat sink to the second IC chip, thermally coupling a third heat sink to the third IC chip, the third heat sink having i) an under side, and ii) a top side opposite the under side, wherein the third heat sink is positioned so that:

the top side of the third heat sink is located further from the substrate in the first direction than the under side of the third heat sink, and the under side of the third heat sink is located further from the substrate in the first direction than the top side of the second heat sink.

12. The method of claim 11, wherein thermally coupling the third heat sink to the third IC chip comprises thermally coupling the third heat sink to the third IC chip via a second heat conducting structure.

* * * * *